(12) United States Patent
Lee et al.

(10) Patent No.: US 6,911,402 B2
(45) Date of Patent: Jun. 28, 2005

(54) DEPOSITION METHOD OF A DIELECTRIC LAYER

(75) Inventors: Jung-Hyun Lee, Suwon (KR); Yo-Sep Min, Seoul (KR); Young-Jin Cho, Bupyeong-gu (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/617,767

(22) Filed: Jul. 14, 2003

(65) Prior Publication Data

US 2004/0018747 A1 Jan. 29, 2004

(30) Foreign Application Priority Data

Jul. 20, 2002 (KR) ........................................ 2002-42763

(51) Int. Cl.⁷ ............................................. H10L 21/31
(52) U.S. Cl. ........................ 438/763; 438/3; 438/240; 438/396
(58) Field of Search .................... 438/310, 3, 240, 438/393, 396, 763; 257/310

(56) References Cited

U.S. PATENT DOCUMENTS

| | | | |
|---|---|---|---|
| 5,284,689 A | * 2/1994 | Marshall et al. | ............. 428/216 |
| 5,688,724 A | * 11/1997 | Yoon et al. | ................. 438/778 |
| 6,320,213 B1 | * 11/2001 | Kirlin et al. | ................ 257/295 |
| 6,407,435 B1 | * 6/2002 | Ma et al. | .................... 257/411 |
| 6,551,730 B1 | * 4/2003 | Barbezat et al. | ............ 428/701 |
| 6,660,660 B2 | * 12/2003 | Haukka et al. | ............. 438/778 |

FOREIGN PATENT DOCUMENTS

| | | |
|---|---|---|
| EP | 0 540 994 A1 | 5/1993 |
| EP | 1 341 217 A2 | 9/2003 |
| JP | 2001-267566 | 9/2001 |
| WO | WO 02/31875 A3 | 4/2002 |
| WO | WO 02/31875 A2 | 4/2002 |

OTHER PUBLICATIONS

Choi, et al., *, Jpn. J. of Applied Physics, 40(4B, Part 1):2940–2942, (Apr. 2001).
* Entitled: "Electrical Characteristics of Pt/SrBi2Ta2O9/Ia2O5/Si Using Ta2O5 as the Buffer Layer".
Clark–Phelps, et al. **, Mat. Res. Soc. Symp. Proc. vol. 670, Society, K2.2.1–6 (2001).
** Entitled: "Engineered tantalum aluminate and hafnium aluminate ALD films for ultrathin ... ".
Wilk, et al., ***, Journal of Applied Physics, vol. 89, No. 10:5243–5275, (May 15, 2001).
*** Entitled: "High–k gate dielectrics: Current status and materials properties considerations".

* cited by examiner

*Primary Examiner*—Amir Zarabian
*Assistant Examiner*—Christy Novacek
(74) *Attorney, Agent, or Firm*—Lee, Sterba & Morse, P.C.

(57) ABSTRACT

A method for depositing a dielectric layer having a multi-layer structure on a substrate includes forming an oxidation barrier layer on a surface of a substrate; forming a plurality of dielectric layers on the oxidation barrier layer, wherein one of a plurality of additional oxidation barrier layers is disposed between each of the plurality of dielectric layers and an adjacent dielectric layer. Accordingly, a capacitor having low leakage current and high capacitance is obtained. In addition, a dielectric constant is controlled by adjusting a lattice constant so that a multi-layer structure of high dielectric constant is formed on a large substrate.

15 Claims, 8 Drawing Sheets

DEPOSITION METHOD OF A DIELECTRIC LAYER

BACKGROUND OF THE INVENTION

1. Field of the Invention

The present invention relates to a method for depositing a dielectric layer. More particularly, the present invention relates to a method for depositing a dielectric layer using a barrier layer, which prevents the oxidization and diffusion of the constituents of a lower electrode.

2. Description of the Related Art

A dielectric layer having a high dielectric constant is used as a buffer layer for forming a large gallium-arsenide (GaAs) substrate, a capacitor, and a gate insulating layer in a conventional memory device. In particular, the dielectric layer is mainly used in a capacitor in memory, such as a dynamic random access memory (DRAM). As memory has become highly integrated, a capacitor having high capacitance is required to form semiconductor devices within a limited area.

A capacitor is formed of conductors facing each other and of a dielectric layer disposed therebetween to attain capacitance of a predetermined level. The capacitance of a capacitor is directly proportional to the effective area and the dielectric constant of the dielectric layer. The capacitance of a capacitor is inversely proportional to the thickness of the dielectric layer. Thus, when a capacitor is formed using a material having a high dielectric constant, the thickness of the capacitor is reduced, and an effective area is increased, capacitance of that capacitor increases. In order to increase the effective area of a capacitor in a memory device, such as a DRAM, the effective area of a dielectric layer deposited on a lower electrode is increased by forming the lower electrode vertically, i.e., having a reduced width and an increased height.

FIG. 1 is a transmission electron microscope (TEM) photograph illustrating a multi-layer structure formed by depositing a strontium titanate (STO; $SrTiO_3$) dielectric layer on a silicon (Si) substrate. In the case of depositing the STO dielectric layer on the Si substrate as shown in FIG. 1, the Si substrate is likely to be oxidized by oxygen introduced in an oxide layer deposition process so that a silicon dioxide ($SiO_2$) dielectric layer is formed on the Si substrate. In addition, amorphous $SiO_2$ causes disorder in a lattice arrangement of an initial STO dielectric layer. Furthermore, a portion of the Si substrate is diffused to the STO dielectric layer in a subsequent thermal process so that the crystalline STO dielectric layer is broken. Referring to FIG. 1, a capacitor, in which the $SiO_2$ dielectric layer and the STO dielectric layer are sequentially arranged on the Si substrate, is formed in a structure where a capacitor formed of the STO dielectric layer and the capacitor formed of the $SiO_2$ dielectric layer are sequentially connected. Therefore, the capacitance of the capacitor is reduced and electric characteristics of the capacitor deteriorate.

In order to solve the above-problems, a method for depositing a dielectric layer after the formation of a metal electrode, such as ruthenium (Ru) or titanium nitride (TiN), on an Si substrate has been developed. FIG. 2 is a graph illustrating the relationship between the ratio of oxygen to the content of metal ($O_2/(Ti+Al+Ru+N)$) and the activities of each metal in the case where an STO dielectric layer is deposited after TiN and Ru metal electrodes are deposited on an Si substrate.

Referring to FIG. 2, the activity of Ru is high in an oxidation atmosphere for depositing a dielectric layer so that Ru is likely to be transformed into ruthenium oxide ($RuO_2$), thus, a thermal process of high temperature cannot be performed on Ru. In addition, TiN located between Si and Ru is transformed into titanium oxide ($TiO_2$) according to the following chemical formula 1 and the activity of TiN steadily drops. Thus, TiN is likely to be broken, and therefore, it is difficult to produce a vertical capacitor having a thickness of less than 70 nm using TiN.

$$2TiN+2O_2 \rightarrow 2TiO_2+N_2 \quad \text{[chemical formula 1]}$$

In addition, a capacitor formed in a memory device, such as a DRAM, stores a small number of charges so that information loss occurs due to even a weak leakage current. Therefore, a method for depositing a dielectric layer and preventing leakage current are required.

SUMMARY OF THE INVENTION

In an effort to solve the above and related problems, it is a feature of an embodiment of the present invention to provide a method for depositing a dielectric layer having a high dielectric constant and a low leakage current in order to prevent the generation of a low dielectric layer between a silicon layer and an adjacent dielectric layer.

To provide the above and other features of an embodiment of the present invention, a method for depositing a dielectric layer having a multi-layer structure on a substrate includes forming an oxidation barrier layer on a surface of a substrate; forming a plurality of dielectric layers on the oxidation barrier layer, wherein one of a plurality of additional oxidation barrier layers is disposed between each of the plurality of dielectric layers and an adjacent dielectric layer.

Preferably, each of the oxidation barrier layers is formed of a layer of a material selected from the group consisting of groups III, IV, and V metal electrodes and oxides thereof. The metal electrodes are preferably selected from the group consisting of aluminum (Al), tantalum (Ta), titanium (Ti), hafnium (Hf), and zirconium (Zr). The metal oxide is preferably selected from the group consisting of aluminum oxide ($Al_2O_3$), tantalum oxide (TaO), titanium oxide ($TiO_2$), hafnium oxide ($HfO_2$), and zirconium oxide ($ZrO_2$).

Preferably, each of the oxidation barrier layers has a thickness of between about tens to hundreds Å, and the thickness of each of the oxidation barrier layers is adjustable.

Preferably, metal of the oxidation barrier layer is diffused into adjacent dielectric layers, and the metal is terminated by depositing the dielectric layer and performing a thermal process, i.e., after the metal chemically reacts with the atoms of the dielectric layer, none of the original metal compound remains because the chemical state of the metal component has changed. The thermal process is preferably performed at a temperature of lower than about 700° C.

It is preferable that each of the oxidation barrier layers is deposited by a chemical vapor deposition (CVD) method, and that each of the dielectric layers is deposited by an atomic layer deposition (ALD) method or a CVD method.

Preferably, each of the dielectric layers is formed of a material selected from the group consisting of strontium titanate (STO), barium titanate (BTO), barium strontium titanate (BST), lead lanthanium titanate (PLT), lead tantalum zirconium (PLZ), and strontium bismuth tantalite (SBT).

In the present invention, oxidation barrier layers are deposited between a substrate and a dielectric layer and between subsequently deposited dielectric layers to avoid the generation of a low dielectric layer, such as $SiO_2$, by preventing the oxidation of the silicon substrate and to attain a multi-layer structure having a high dielectric constant and low leakage current.

BRIEF DESCRIPTION OF THE DRAWINGS

The above features and advantages of the present invention will become more apparent to those of ordinary skill in the art by describing in detail preferred embodiments thereof with reference to the attached drawings in which.

DETAILED DESCRIPTION OF THE INVENTION

Figure 1:
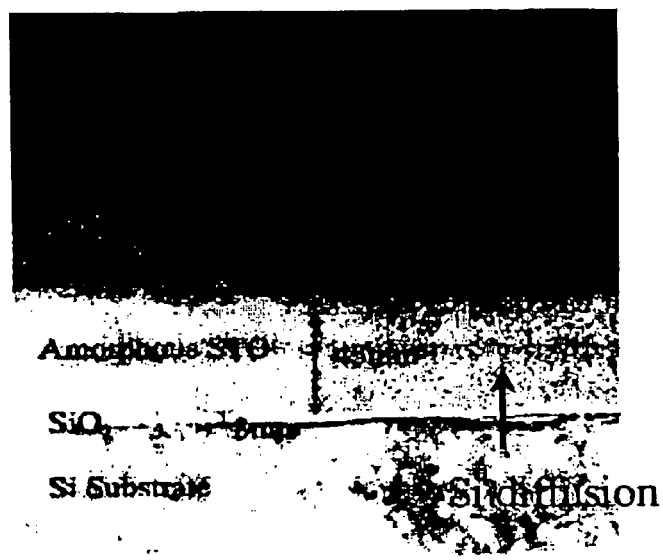
FIG. 1 is a transmission electron microscope (TEM) photograph illustrating a multi-layer structure formed by depositing strontium titanate (STO; $SrTiO_3$) on a silicon (Si) substrate.
Figure 2:
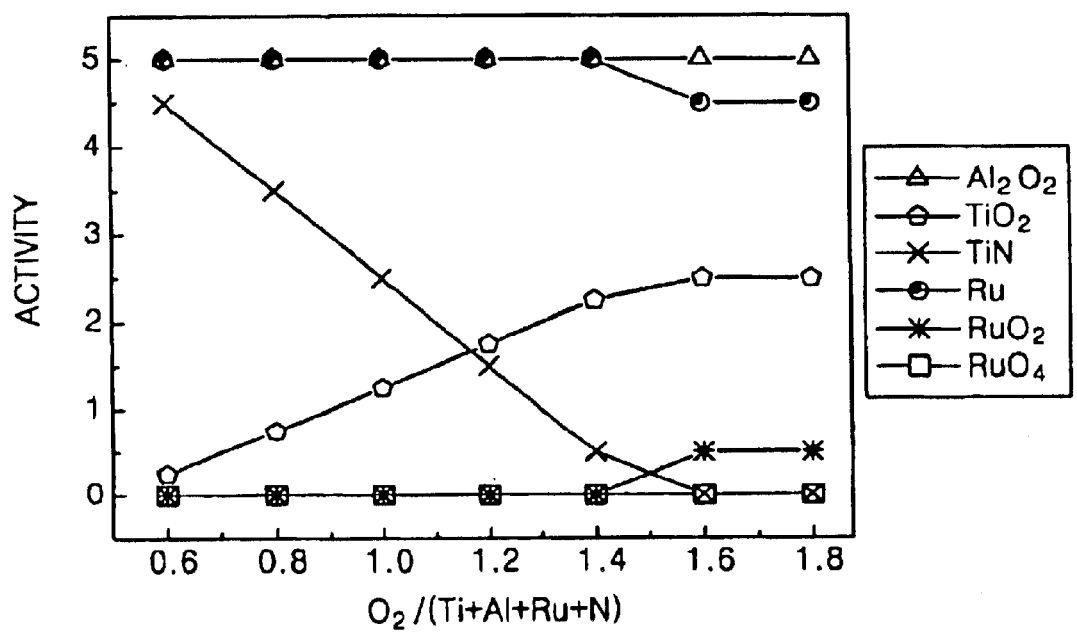
FIG. 2 is a graph illustrating activities of each material in the case where a dielectric layer is deposited using a conventional metal interconnection.

Korean Patent Application No. 2002-42763, filed Jul. 20, 2002, and entitled: "Deposition Method of Dielectric Layer," is incorporated by reference herein in its entirety.

A method for depositing a dielectric layer according to the present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Figure 3A:
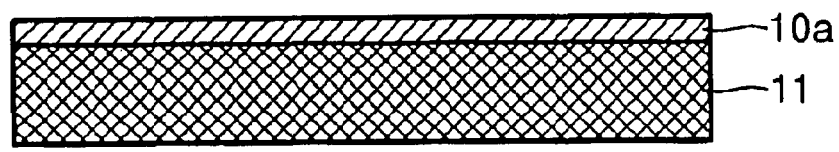
FIGS. 3A through 3D illustrate sectional views of stages in a method for depositing a dielectric layer according to an embodiment of the present invention.
Figure 3B:
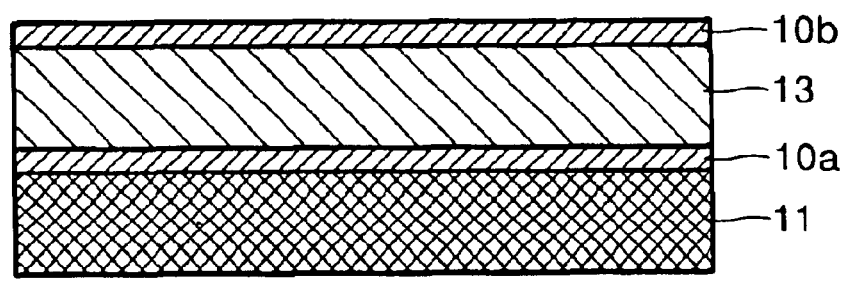
Figure 3C:
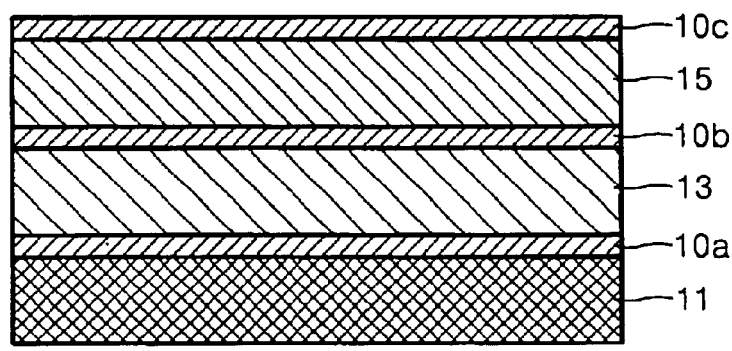
Figure 3D:
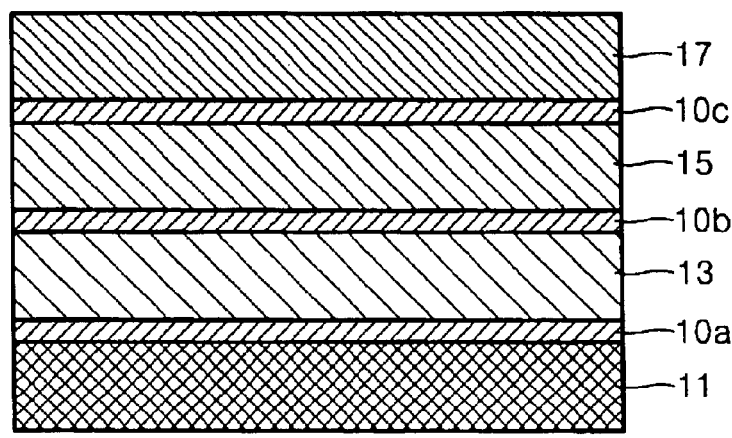

FIGS. 3A through 3D illustrate sectional process views of stages in a method for depositing a dielectric layer according to an embodiment of the present invention. As shown in FIG. 3A, a first oxidation barrier layer 10a is deposited on a substrate 11. Thereafter, a first dielectric layer 13 is deposited on the first oxidation barrier layer 10a, and a second oxidation barrier layer 10b is deposited on the first dielectric layer 13, as shown in FIG. 3B. Subsequently, a second dielectric layer 15 is deposited on the second oxidation barrier layer 10b, and then a third oxidation barrier layer 10c is deposited on the second dielectric layer 15 in the same manner as shown in FIG. 3C. As shown in FIG. 3D, a third dielectric layer 17 is deposited on the third oxidation barrier layer 10c to complete a multi-layer structure having a three-fold dielectric layer.

A method for depositing a dielectric layer according to an embodiment of the present invention prevents oxidation by inserting an oxidation barrier layer between the substrate and a first dielectric layer, and between each subsequently deposited dielectric layer. Here, the first through third dielectric layers 13, 15, and 17 may be formed of the same material or different materials. Although three dielectric layers are formed in this embodiment of the present invention, additional layers may be formed.

Each of the oxidation barrier layers 10a, 10b, 10c are preferably formed of a dielectric layer, such as a material selected from the group consisting of groups III, IV, and V metal electrodes and oxides thereof, which are more easily oxidized than the material used as the substrate 11. Examples of the metal electrodes or oxides thereof include aluminum (Al), tantalum (Ta), titanium (Ti), hafnium (Hf), and zirconium (Zr) or aluminum oxide ($Al_2O_3$), tantalum oxide (TaO), titanium oxide ($TiO_2$), hafnium oxide ($HfO_2$), and zirconium oxide ($ZrO_2$). Preferably, each of the oxidation barrier layers 10a, 10b, and 10c have a thickness of tens to hundreds of Å, and preferably the thickness of each of the oxidation barrier layers 10a, 10b, and 10c can be adjusted according to the structure of a device. Each of the oxidation barrier layers 10a, 10b, and 10c are preferably deposited by an atomic layer deposition (ALD) method. The ALD method is a thin film deposition technique using the chemical adsorption and desorption of an atomic layer. Here, each reactant material is separated and supplied to a chamber in a pulse type so that the reactant material is deposited on the substrate by the chemical adsorption and desorption according to the saturated surface reaction of the reactant material.

The first through third dielectric layers 13, 15, and 17 are preferably formed of a dielectric material having a high dielectric constant K, for example, strontium titanate (STO; SrTiO3), lead lanthanium titanate (PLT), barium titanate (BTO), barium strontium titanate (BST), lead tantalum zirconium (PLZ), and strontium bismuth tantalite (SBT).

The dielectric layers 13, 15, and 17 may be deposited by an ALD method or a chemical vapor deposition (CVD) method. Here, the CVD method is a technique where vapor injected to a reactor chemically reacts on a substrate by energy, such as heat or plasma, to form a thin layer. The CVD method is able to obtain a crystalline layer or an amorphous layer having high purity and without defect at a relatively low temperature. In addition, the CVD method is able to form various types of thin layers and easily adjust stoichiometric composition.

A method for depositing a dielectric layer according to an embodiment of the present invention may further include a thermal process in a high temperature oxidation atmosphere after forming a multi-layer structure where additional dielectric layers have been deposited with an oxidation barrier layer between adjacent dielectric layers and between a dielectric layer and the substrate. Preferably, this thermal process is performed at a temperature of less than about 700° C. If the thermal process is continuously performed, the metal atoms of the oxidation barrier layers 10a, 10b, and 10c are diffused to adjacent dielectric layers 13, 15, or 17, and the diffused metal atoms are cooled and crystallized so that the lattice constant of the dielectric layers 13, 15, and 17 is changed. When the ion radius of the metal atoms of the oxidation barrier layers 10a, 10b, 10c is small, the lattice constant of the first through third dielectric layers 13, 15, and 17 is reduced. In the opposite case, the lattice constant of the dielectric layers 13, 15, and 17 is increased. By way of example, the lattice constant a of the STO dielectric layer is 0.3905 nm when the method for depositing a dielectric layer according to an embodiment of the present invention is performed. However, when the Hf atoms are diffused after the thermal process, the lattice constant a of the STO dielectric layer increases to 0.3923 nm.

Figure 4A:
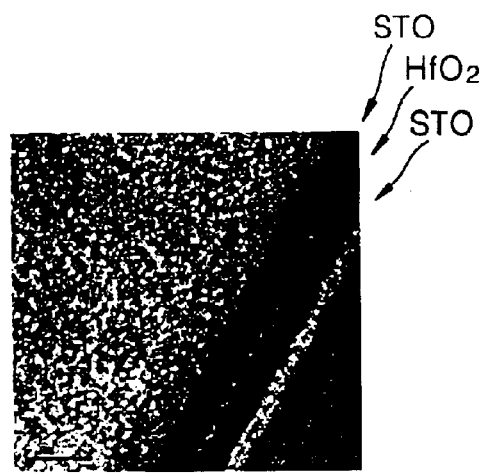
FIG. 4A is a TEM photograph illustrating a multi-layer structure of STO/hafnium oxide ($HfO_2$)/STO before a method for depositing a dielectric layer according to an embodiment of the present invention is used.
Figure 4B:
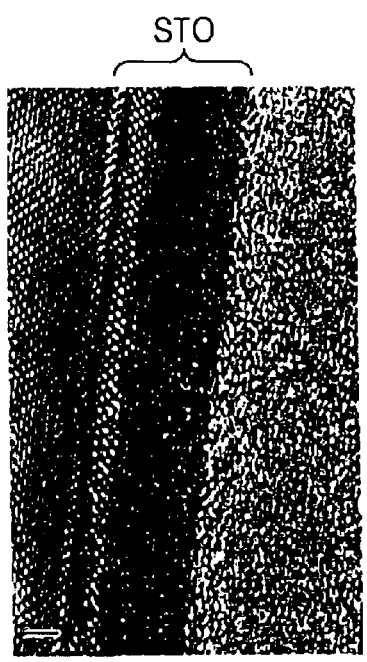
FIG. 4B is a TEM photograph illustrating a multi-layer thin film structure transformed from the multi-layer structure of FIG. 4A by a thermal process performed at a temperature lower than about 700° C.

FIG. 4A is a TEM photograph illustrating a multi-layer structure of STO/HfO$_2$/STO deposited by a method for depositing a dielectric layer according to an embodiment of the present invention. FIG. 4B is a TEM photograph illustrating a multi-layer structure transformed from the multi-layer structure of FIG. 4A by a thermal process.

Referring to FIG. 4A, a HfO$_2$ layer is inserted between STO layers. When a thermal process is performed, the metal ions of the HfO$_2$ layer are diffused to adjacent dielectric layers and terminated. Here, a distance between the STO dielectric layers is changed from 0.3905 nm to 0.3923 nm by the thermal process. In the case where a layer, such as gallium-arsenide (GaAs), is deposited on the STO layer, the changed crystalline layers may relieve stress due to incongruence of the lattice constant. Here, the structure of inserting an oxidation barrier layer onto an STO dielectric layer and depositing a GaAs layer may be used for manufacturing an optical recording medium.

Figure 5:
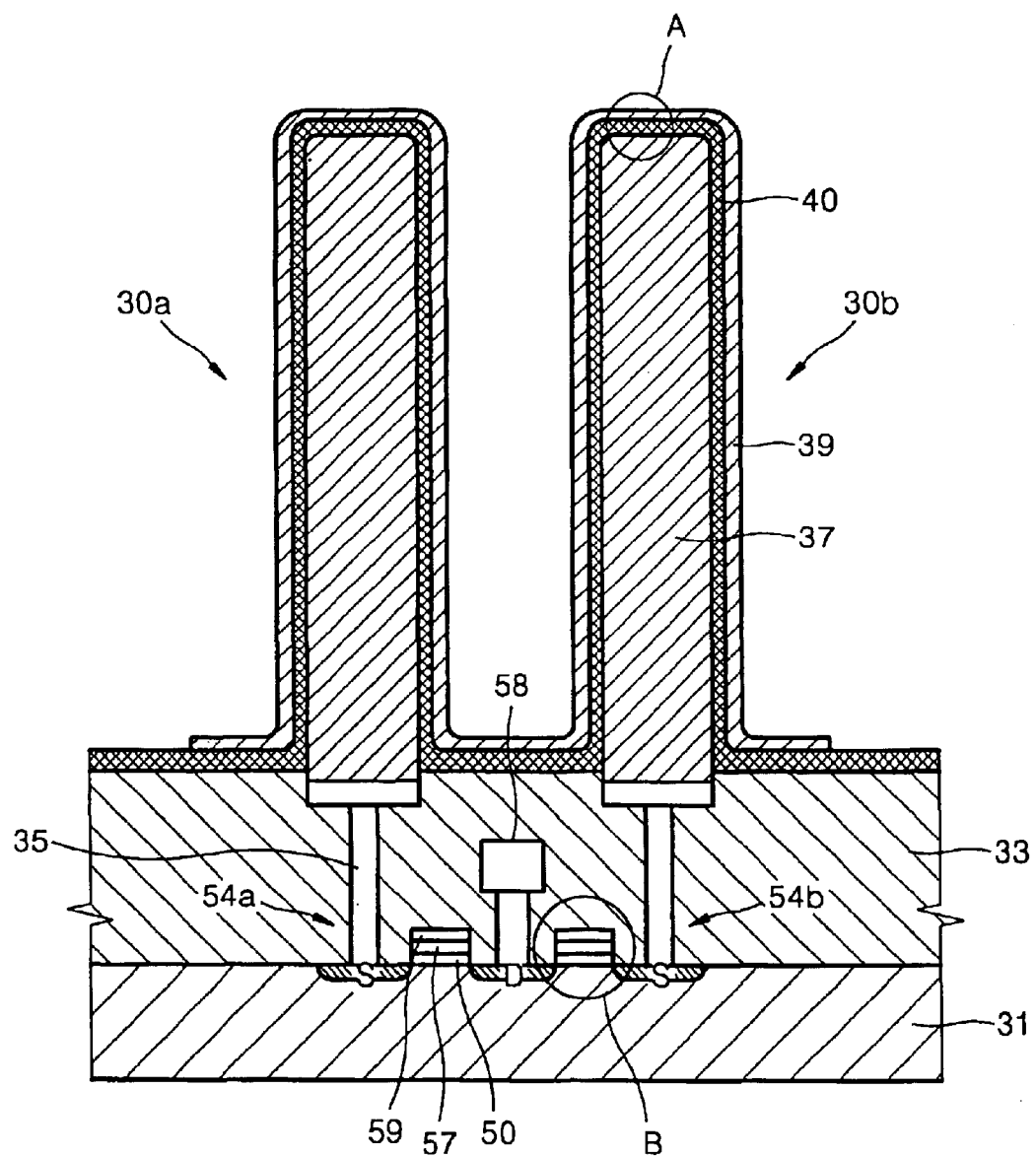
FIG. 5 illustrates a sectional view of a DRAM structure having capacitors on which a dielectric layer is deposited by a method for depositing a dielectric layer according to an embodiment of the present invention.

FIG. 5 illustrates a schematic view of a DRAM structure having two capacitors 30a and 30b having a dielectric layer 40 deposited by a method for depositing a dielectric layer according to an embodiment of the present invention.

Referring to FIG. 5, the DRAM has two transistors 54a and 54b and two capacitors 30a and 30b. The transistors 54a and 54b are each formed of a source electrode S, a common drain electrode D, and a gate electrode 57, where a word line 59 is arranged on the gate electrode 57 in a stripe type, and a common bit line 58 is formed between each of the gate electrodes.

More specifically, each of the source electrodes S and the common drain electrode D are formed on a surface of a substrate 31 to a predetermined depth and each of the gate electrodes 57 is disposed between a source electrode S and the common drain electrode D. Between the gate electrode 57 and the substrate 31, a plurality of dielectric layers 53 and 55 as insulating layers and a plurality of oxidation barrier layers 51a and 51b are alternately stacked. Conductive plugs 35 are located to contact the source electrodes S in an insulating layer 33, and column shaped lower electrodes 37 are located on the conductive plugs 35. A multi-layer dielectric layer 40 is deposited on the lower electrodes 37, and an upper electrode 39 is deposited on the multi-layer dielectric layer 40.

Figure 6A:
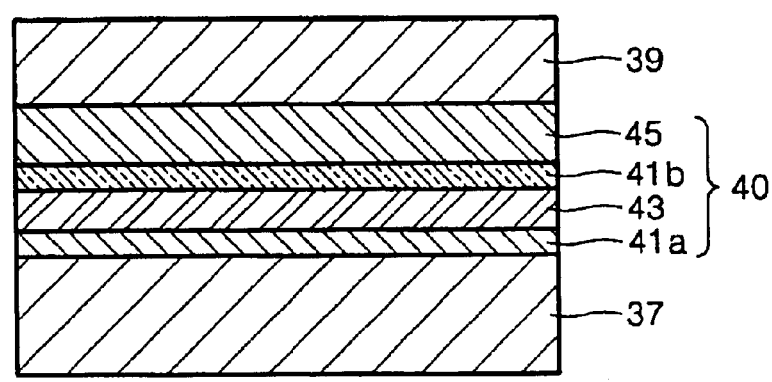
FIG. 6A illustrates an enlarged sectional view of portion A of FIG. 5.

FIG. 6A illustrates an enlarged sectional view of portion A of FIG. 5 that illustrates the multi-layer structure of the dielectric layer 40 of each of the capacitors 30a and 30b. A first oxidation barrier layer 41a is deposited on the lower electrode 37, and a first dielectric layer 43, a second oxidation barrier layer 41b, and a second dielectric layer 45 are sequentially deposited to form the multi-layer dielectric layer 40. The upper electrode 39 is then deposited on the multi-layer dielectric layer 40 to complete a capacitor.

Figure 6B:
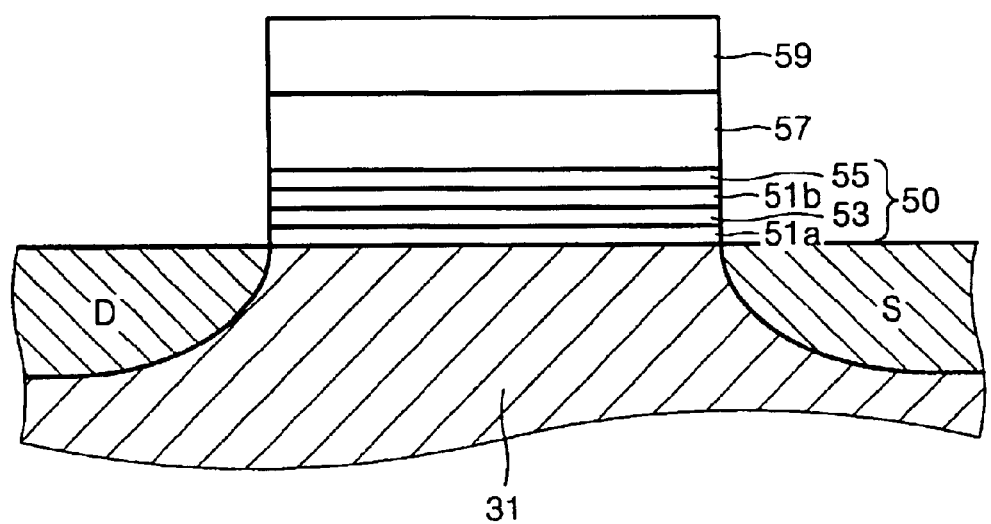
FIG. 6B illustrates an enlarged sectional view of portion B of FIG. 5.

FIG. 6B illustrates an enlarged sectional view of portion B of FIG. 5 that illustrates the structure of each of the transistors 54a and 54b. A word line 59 is located between source and drain electrodes S and D, and a gate electrode 57 is formed beneath the word line 59. A first oxidation barrier layer 51a, a first dielectric layer 53, a second oxidation barrier layer 51b, and a second dielectric layer 55 are sequentially deposited between the gate electrode 57 and the substrate 31 to form a multi-layer structure 50.

The capacitor having a multi-layer dielectric layer where oxidation barrier layers 51a and 51b and dielectric layers 53 and 55 are alternately formed reduces leakage current and increases capacitance.

Figure 7:
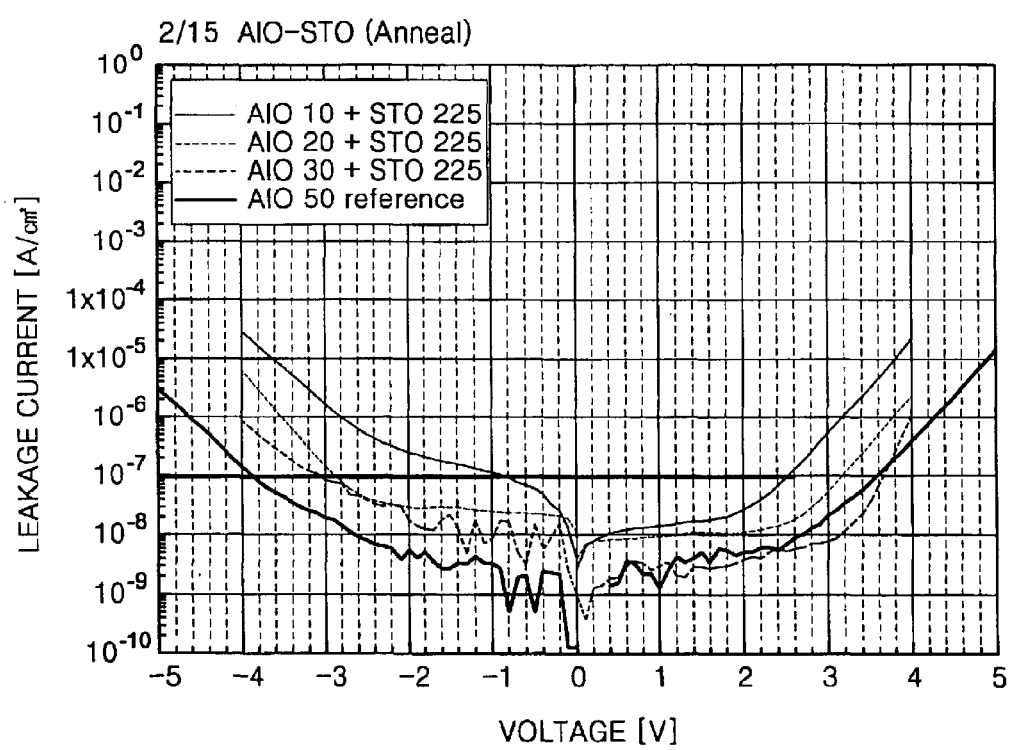
FIG. 7 is a graph illustrating changes in leakage current with respect to changes in voltage in a multi-layer structure of aluminum oxide (AlO)/STO deposited by a method for depositing a dielectric layer according to an embodiment of the present invention.

FIG. 7 is a graph illustrating changes in leakage current with respect to changes in voltage when an oxidation barrier layer of AlO and a dielectric layer of STO are deposited by a method for depositing a dielectric layer according to an embodiment of the present invention.

Referring to FIG. 7, if the thickness of the STO dielectric layer is kept constant at 22.5 nm, the thickness of the oxidation barrier layer of AlO is varied between 1, 2, 3, and 5 nm, a voltage range is from −4 to 3 V, and the leakage current is less than $10^{-7}$ A/cm$^2$, i.e., a reference leakage current. Since the leakage current is almost equal to a minimum leakage current value according to changes in voltage of the oxidation barrier layer of AlO, the leakage current is considerably reduced.

Figure 8:
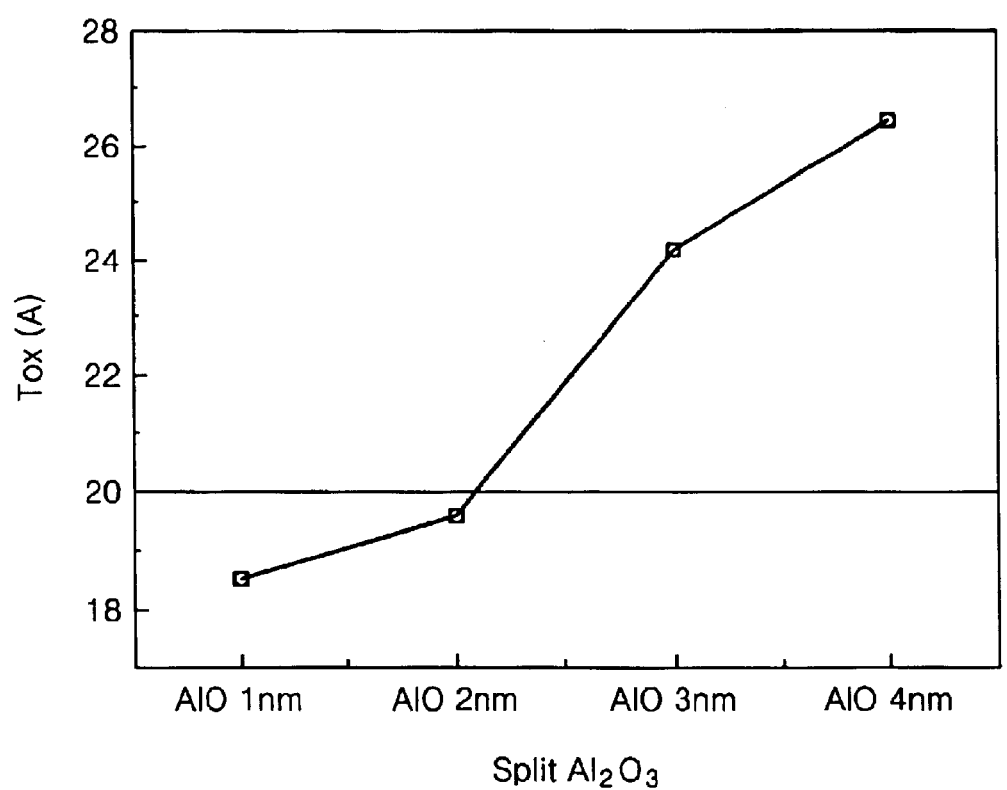
FIG. 8 is a graph illustrating changes in capacitance with respect to changes in thickness of AlO in a multi-layer structure of AlO/STO deposited by a method for depositing a dielectric layer according to an embodiment of the present invention.

FIG. 8 is a graph illustrating changes in capacitance with respect to changes in AlO when an oxidation barrier layer of AlO and a dielectric layer of STO are deposited by a method for depositing a dielectric layer according to an embodiment of the present invention.

Referring to FIG. 8, the x-axis denotes changes in the thickness of AlO and the y-axis denotes changes in capacitance, which is converted into a corresponding thickness of SiO$_2$. When the SiO$_2$ is established to a thickness of 20 Å as the thickness of a reference capacitance, the converted thickness of a multi-layer structure is less than the thickness of the reference capacitance when the thickness of AlO is less than 2 nm. As a result, the capacitance becomes larger than the reference capacitance, because capacitance C is inversely proportional to thickness d as shown in Equation 1.

$$C = \varepsilon \frac{A}{d} \quad (1)$$

wherein $\varepsilon$ denotes a dielectric constant and A denotes the area of a capacitor.

A multi-layer structure deposited using a method for depositing a dielectric layer according to an embodiment of the present invention results in low leakage current and high capacitance. Thus, the multi-layer structure according to the present invention may be used in various electronic devices and optical devices, such as a memory device requiring high performance or an optical recording medium.

The method for depositing a dielectric layer according to the present invention has the advantages of obtaining a capacitor and a gate insulating layer having low leakage current and high capacitance by controlling the lattice constant of a dielectric layer and manufacturing a substrate, such as a large GaAs substrate, by controlling the surface distance between crystals.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for depositing a dielectric layer having a multi-layer structure on a substrate, comprising:

forming an oxidation barrier layer on a surface of a substrate;

forming a plurality of dielectric layers on the oxidation barrier layer, wherein one of a plurality of additional oxidation barrier layers is disposed between each of the plurality of dielectric layers and an adjacent dielectric layer; and diffusing material in each of the oxidation barrier layers into adjacent dielectric layers sufficient to alter at least one characteristic of each of the plurality of dielectric layers, wherein the material for each of the oxidation barrier layers is selected from the group consisting of groups III, IV, and V metals and oxides thereof and the diffusing includes diffusing the metal of the oxidation barrier layer into adjacent dielectric layers until none of an original metal compound remains in the oxidation barrier layer.

2. The method as claimed in claim 1, wherein each of the oxidation barrier layers has a thickness of between about one to two orders of magnitude of Å.

3. The method as claimed in claim 1, wherein the thickness of each of the oxidation barrier layers is adjustable.

4. The method as claimed in claim 1, wherein each of the oxidation barrier layers is deposited by a chemical vapor deposition (CVD) method.

5. The method as claimed in claim 1, wherein each of the dielectric layers is deposited by an atomic layer deposition (ALD) method or a CVD method.

6. The method as claimed in claim 1, wherein each of the dielectric layers is formed of a material selected from the group consisting of strontium titanate (STO), barium titanate (BTO), barium strontium titanate (BST), lead lanthanium titanate (PLT), lead tantalum zirconium (PLZ), and strontium bismuth tantalite (SBT).

7. The method as claimed in claim 1, wherein the at least one characteristic of the plurality of dielectric layers is a lattice constant.

8. The method as claimed in claim 1, wherein the diffusing comprises:

performing a thermal process on each oxidation barrier layer after adjacent dielectric layers are formed.

9. The method as claimed in claim 8, wherein the thermal process is performed at a temperature lower than about 700° C.

10. The method as claimed in claim 1, wherein the metals are selected from the group consisting of aluminum (Al), tantalum (Ta), titanium (Ti), hafnium (Hf), and zirconium (Zr).

11. The method as claimed in claim 10, wherein the diffusing comprises:

performing a thermal process on each oxidation barrier layer after adjacent dielectric layers are formed.

12. The method as claimed in claim 11, wherein the thermal process is performed at a temperature lower than about 700° C.

13. The method as claimed in claim 1, wherein the metal oxide is selected from the group consisting of aluminum oxide ($Al_2O_3$), tantalum oxide (TaO), titanium oxide ($TiO_2$), hafflium oxide ($HfO_2$), and zirconium oxide ($ZrO_2$).

14. The method as claimed in claim 13, wherein the diffusing comprises:

performing a thermal process on each oxidation barrier layer after adjacent dielectric layers are formed.

15. The method as claimed in claim 14, wherein the thermal process is performed at a temperature lower than about 700° C.

* * * * *